(12) United States Patent
Akaogi et al.

(10) Patent No.: US 7,295,475 B2
(45) Date of Patent: Nov. 13, 2007

(54) FLASH MEMORY PROGRAMMING USING AN INDICATION BIT TO INTERPRET STATE

(75) Inventors: Takao Akaogi, Cupertino, CA (US); Guowei Wang, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 105 days.

(21) Appl. No.: 11/229,664

(22) Filed: Sep. 20, 2005

(65) Prior Publication Data

US 2007/0064493 A1  Mar. 22, 2007

(51) Int. Cl.
  *G11C 11/34*  (2006.01)
(52) U.S. Cl. .......................... 365/185.28; 365/185.11; 365/185.18
(58) Field of Classification Search ........... 365/185.28, 365/185.11, 185.18
See application file for complete search history.

(56) References Cited

U.S. PATENT DOCUMENTS

| | | | |
|---|---|---|---|
| 5,291,446 A | 3/1994 | Van Buskirk et al. | 365/189.09 |
| 5,539,688 A | 7/1996 | Yiu et al. | 365/185.18 |
| 5,748,534 A | 5/1998 | Dunlap et al. | 365/185.21 |
| 5,757,711 A | 5/1998 | Nakaoka et al. | 365/207 |
| 5,890,192 A | 3/1999 | Lee et al. | 711/103 |
| 6,295,228 B1 | 9/2001 | Pawletko et al. | 365/185.22 |
| 6,426,893 B1 | 7/2002 | Conley et al. | 365/185.11 |
| 6,515,903 B1 | 2/2003 | Le et al. | 365/185.18 |
| 6,563,745 B1 | 5/2003 | Ilkbahar | 365/189.07 |
| 6,570,785 B1 | 5/2003 | Mangan et al. | 365/185.02 |
| 6,665,215 B2 | 12/2003 | Thomas et al. | 365/185.25 |
| 6,735,117 B2 | 5/2004 | Ott | 365/185.18 |
| 6,906,966 B2 | 6/2005 | Shor et al. | 365/185.23 |
| 6,947,347 B2 | 9/2005 | Fujioka | 365/185.33 |
| 7,057,939 B2 * | 6/2006 | Li et al. | 365/185.28 |
| 7,154,794 B2 | 12/2006 | Ahne et al. | 365/185.18 |
| 2002/0167844 A1 | 11/2002 | Han et al. | 365/185.28 |
| 2003/0046481 A1 | 3/2003 | Kushnarenko | 711/103 |
| 2003/0142544 A1 | 7/2003 | Maayan et al. | 365/185.16 |
| 2004/0027857 A1 | 2/2004 | Ooishi | 365/185.11 |
| 2004/0037113 A1 | 2/2004 | Ooishi | 365/185.11 |
| 2004/0109354 A1* | 6/2004 | Wang et al. | 365/185.11 |
| 2007/0035991 A1 | 2/2007 | Chen et al. | 365/185.01 |

OTHER PUBLICATIONS

2002 IEEE International Solid-State Circuits Conference, Session 6, "SRAM and Non-Volatile Memories", Feb. 4, 2004, 6 pages.
2002 IEEE International Solid-State Circuits Conference, 29 pages.
Co-pending U.S. Appl. No. 11/212,614, filed Aug. 29, 2005, entitled: "Voltage Regulator with Less Overshoot and Faster Settling Time," Yonggang Wu et al.; 30 pp.
Co-pending U.S. Appl. No. 11/229,529, filed Sep. 30, 2005, entitled: "Flash Memory Programming with Data Dependent Control of Source Lines," Guowei Wang et al.; 30 pp.
International Search Report mailed Jan. 31, 2007, for corresponding International Application No. PCT/US2006/034990, filed Sep. 7, 2006, 4 pages.

* cited by examiner

*Primary Examiner*—Huan Hoang
(74) *Attorney, Agent, or Firm*—Harrity Snyder LLP

(57) ABSTRACT

Non-volatile memory, such as Flash memory, is programmed by writing a window of information to memory. The programmed/non-programmed state of each memory cell may be dynamically determined for each window and stored as an indication bit. These techniques can provide for improved average power drain and a reduced maximum current per window during programming.

17 Claims, 7 Drawing Sheets

FLASH MEMORY PROGRAMMING USING AN INDICATION BIT TO INTERPRET STATE

TECHNICAL FIELD

The present invention relates generally to non-volatile memory devices, and more specifically, to data programming operations for non-volatile memory devices.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

When programming multiple Flash memory cells at once, power supply circuitry may be used to supply a current to each memory cell (bit) that is to be programmed. Since each circuit that is being programmed may source a fixed amount of current, a limited number of memory cells can be programmed before exhausting the capacity of power supply circuitry.

DISCLOSURE OF THE INVENTION

One aspect is directed to a non-volatile memory device comprising an array of non-volatile memory cells that includes a plurality of groups of memory cells and a plurality of memory cells used to respectively indicate whether a programmed/non-programmed state of the memory cells in one of the groups is interpreted as a logic zero or a logic one.

Another aspect is directed to a method for writing data to memory cells of a non-volatile memory device. The method includes receiving a predetermined number of bits that are to be written and analyzing the predetermined number of bits to determine a logic state of a minority of the bits. The method further includes writing each of the bits to a memory cell in the memory device by programming those that correspond to the minority of the bits and writing an indication bit that indicates the determined logic state of the minority of the bits.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a Flash memory programming technique that dynamically selects how the programmed or non-programmed state of a Flash memory cell is to be interpreted. A special "indication bit" may be used to indicate the selection.

Memory Device Overview

Figure 1:
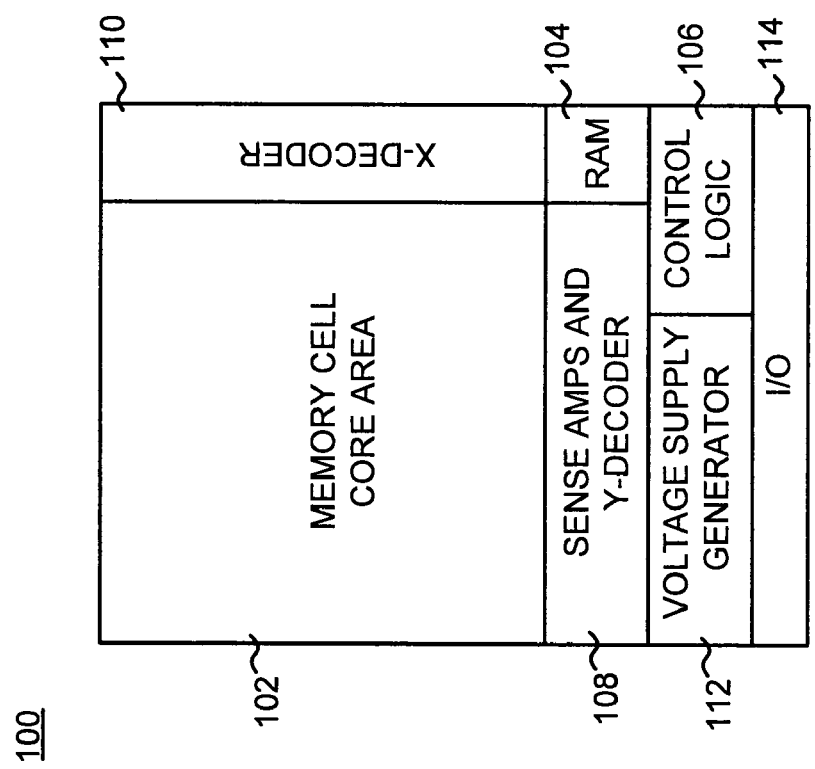
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core area 102. Core area 102 may include arrays of high density memory cells, such as, for example, SONOS-type (silicon-oxide-nitride-oxide-silicon) NOR memory cells, where the nitride layer acts as the charge storage element. More specifically, core area 102 may include multiple M×N memory arrays of substantially identical memory cells.

The memory cells in area 102 may be implemented such that each memory cell can store two or more bits. In one such multi-bit per memory cell technology, called Mirror-Bit™, the intrinsic density of a Flash memory array can be doubled by storing two physically distinct charges on opposite sides of a memory cell. Each charge, representing a bit within a cell, serves as a binary unit of data (e.g. either "1" or "0"). Reading or programming one side of a memory cell occurs independently of the data that is stored on the opposite side of the cell.

Although shown as a single block in FIG. 1, core area 102 may be implemented as a number of memory cell arrays. Each such memory cell array may be associated with X-decoder 110 and Y-decoder 108. X-decoder 110 and Y-decoder 108 may decode address information, such as addresses received by memory device 100 that define a specific byte or word (or groups of bytes or words) that are to be written to or read from. The decoded addresses specify the appropriate physical lines in the memory cell array(s) that are to be used.

Y-decoder 108 may also include appropriate sense amplifier circuitry. Sense amplifiers may be used to sense the programmed or non-programmed state of the memory cells in core area 102.

Random access memory (RAM) 104 may include memory, such as static dynamic random access memory (SRAM) or dynamic random access memory (DRAM) type memory, that can serve as a memory cache between core area 102 and I/O lines/pins 114. Relative to the memory cells in core area 102, RAM 104 may be a higher speed memory and may be a volatile memory (i.e., loses its data when powered down). I/O lines 114 may provide buffering to facilitate data transfer between RAM 104 or between core area 102 and external circuitry.

Voltage supply generator 112 may act as a power supply for the programming, reading, and erasing functions performed on the memory cells in core area 102. Programming and erasing the memory cells, in particular, may require supply voltages larger than those supplied to memory device 100. For example, memory device 100 may be powered from a 3.5 volt source while a program operation may require a higher voltage source. Voltage supply generator 112 may use one or more charge pumps to generate these higher voltages. Consistent with an aspect of the invention and as described in more detail below, voltage supply generator 112 may include a charge pump divided into groups of independent charge pumps.

Control logic 106 may generally control Y-decoder 108, X-decoder 110, RAM 104, voltage supply generator 112, and I/O lines 114 to control the reading, programming, and erasing of memory cell core area 102. Control logic 106 may include a state machine that appropriately manipulates memory cell core area 102 based on input address, data, and control signals received by memory device 100 through I/O lines 114.

Figure 2:
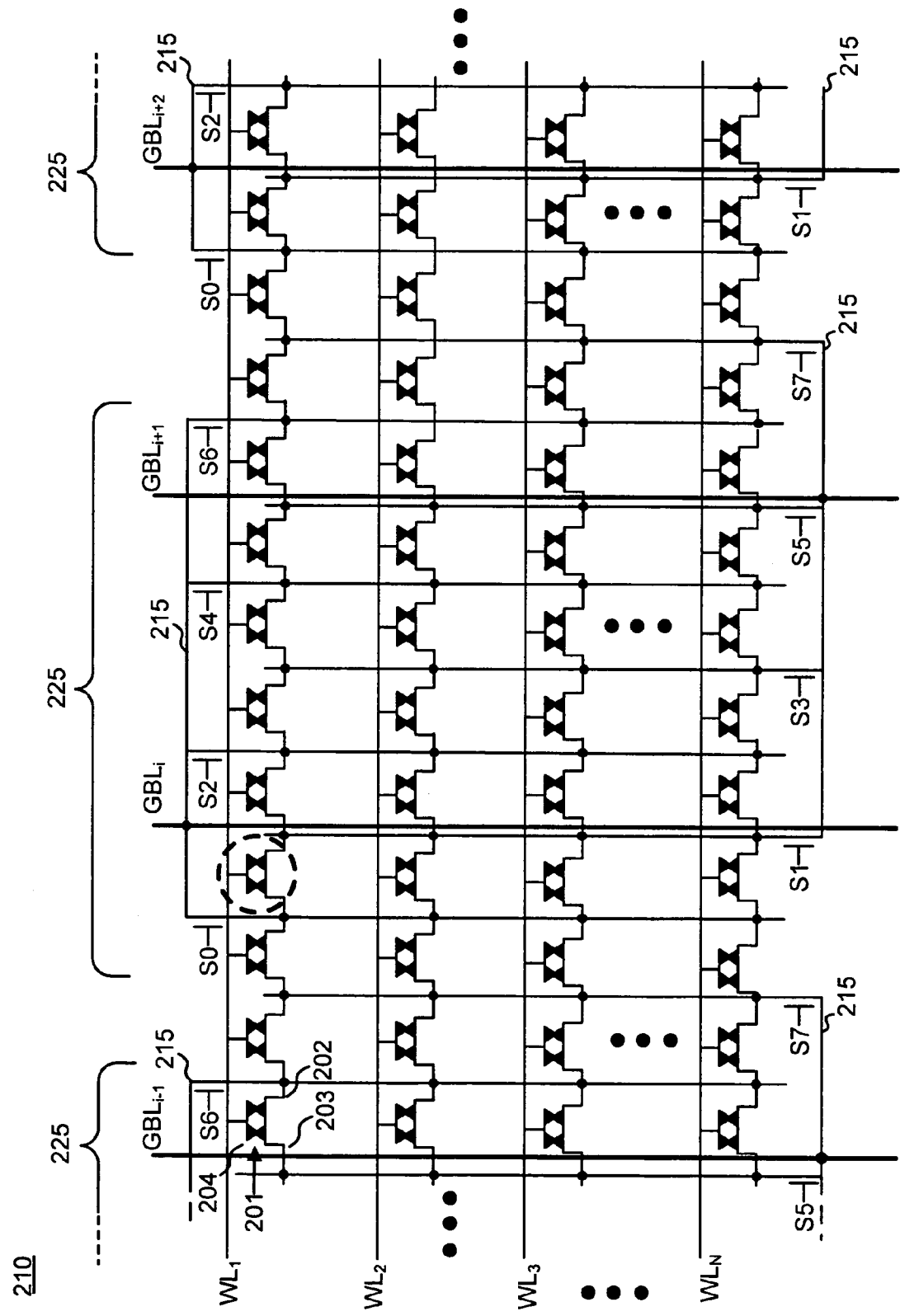
FIG. 2 is a diagram illustrating an exemplary portion of an array of memory cells implemented in the core area of the memory device shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells 201 in a row. Bit lines are arranged orthogonally to the word lines in array 210. The bit lines include global bit lines ($GBL_{i-1}$ through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells 201 in memory array 210. By also activating a word line WL, one memory cell in each group 225 may have its source, drain, and gate terminals all activated, thus allowing programming and reading of this select memory cell. As an example of selecting a particular memory cell within a group 225 (e.g., the memory cell within the dashed circle in FIG. 2), assume that a voltage is placed on $WL_1$, and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core area 102 includes NOR-type Flash memory.

Although only a limited number of bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines may correspond to 256 eight memory cell groups 225 of select transistors.

Figure 3:
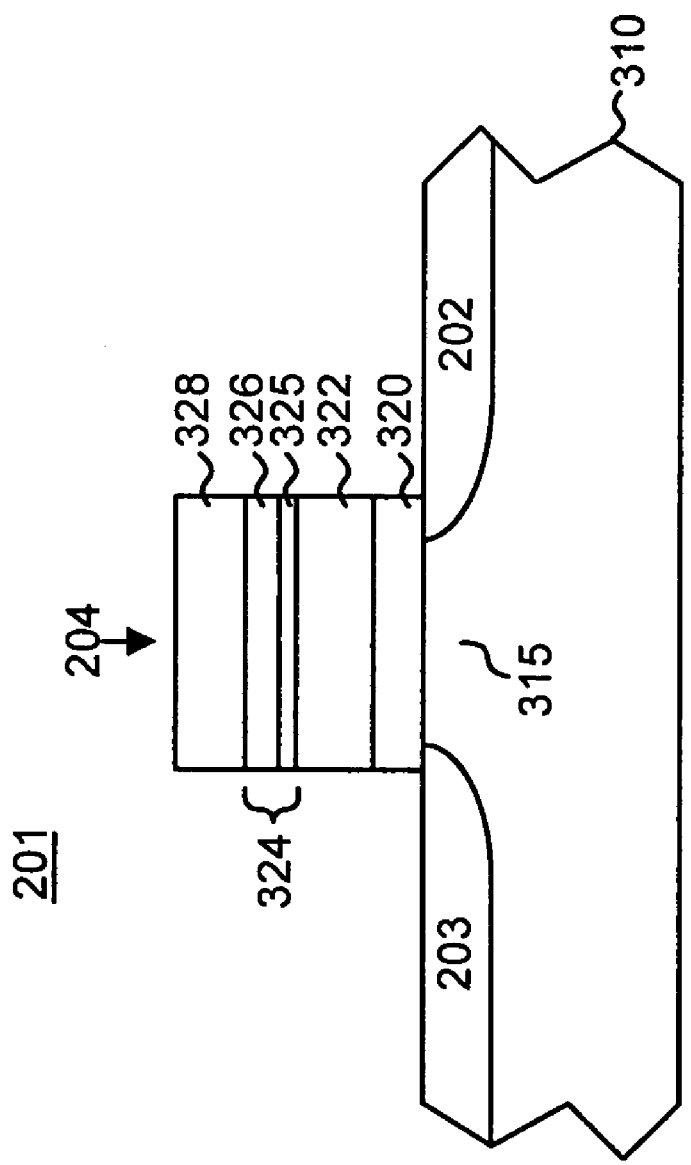
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorus or arsenic, or p-type impurities, such as boron. As previously mentioned, depending on the applied voltages, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternative implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

As an example of a programming operation, memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 215. For example, approximately five volts may be applied to $GBL_i$ and $GBL_{i+1}$ may be grounded. Also, select transistors S0 and S1 may be turned on. These voltages generate a vertical and lateral electric field in the activated memory cell(s) (e.g., the circled memory cell in FIG. 2) along the length of the channel from the source to the drain. This electric field causes electrons to be drawn from the source and begin accelerating toward the drain. As they move along the length of the channel, they gain energy. If they gain enough energy, they can jump over the potential barrier of the dielectric layer 320 into one side of charge storing layer 322 and become trapped. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
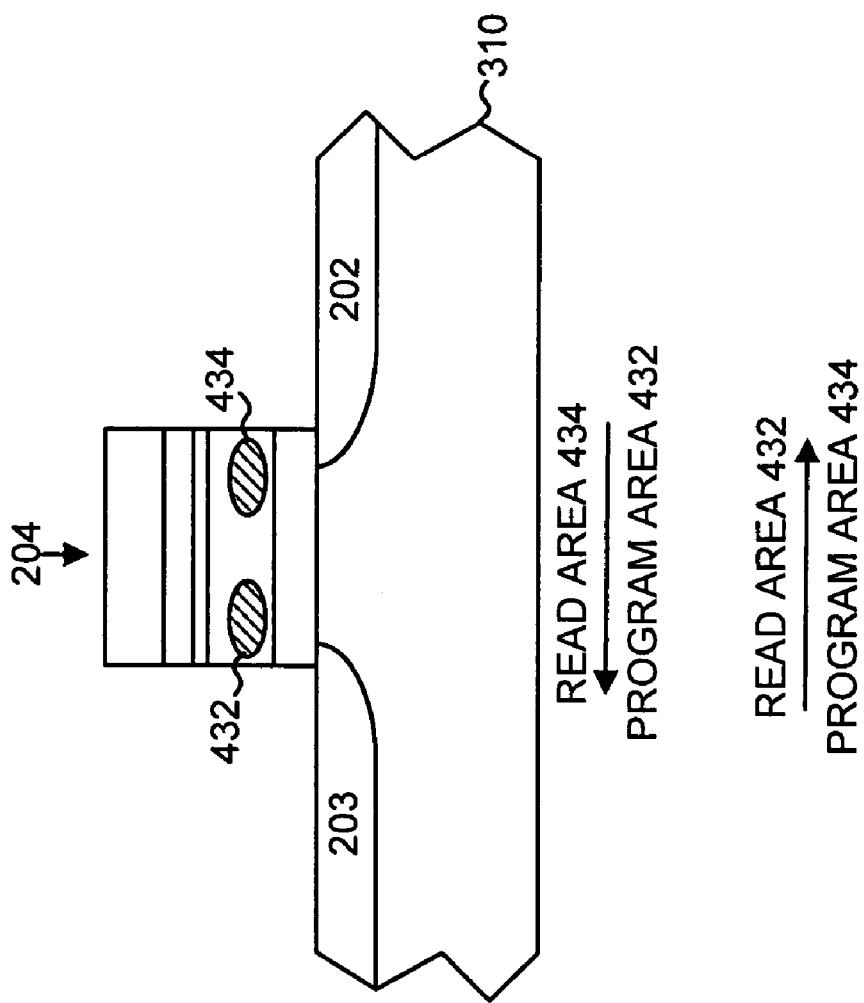

When two bits are stored in charge storage layer 322, the second bit is programmed in a manner similar to the first bit, except that the source and drain terminals are reversed in both directions. FIG. 4 is a diagram similar to FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Programming of the Memory Device

Multiple memory cells 201 in a row (i.e., the memory cells 201 having a common word line) can be simultaneously programmed by activating a programming voltage differential through the global bit lines and select switches S0 through S7 to the source and drain of each memory cell 201 that is to be programmed. Voltage supply generator 112 may provide this program voltage. In some implementations, it may be desirable to simultaneously activate the bit lines for a memory cell 201 from every group 225 of a row. Practically, however, the power drawn by each of the bit lines from voltage supply generator 112 may be too much to simultaneously program more than a portion of the total number of possible memory cells 201. For example, in the previously mentioned implementation, in which a memory cell array in core area 102 includes 2,048 memory cells, memory cells 201 may be programmed in discrete programming "windows," in which each window includes, for example, 64 bits.

Figure 5:
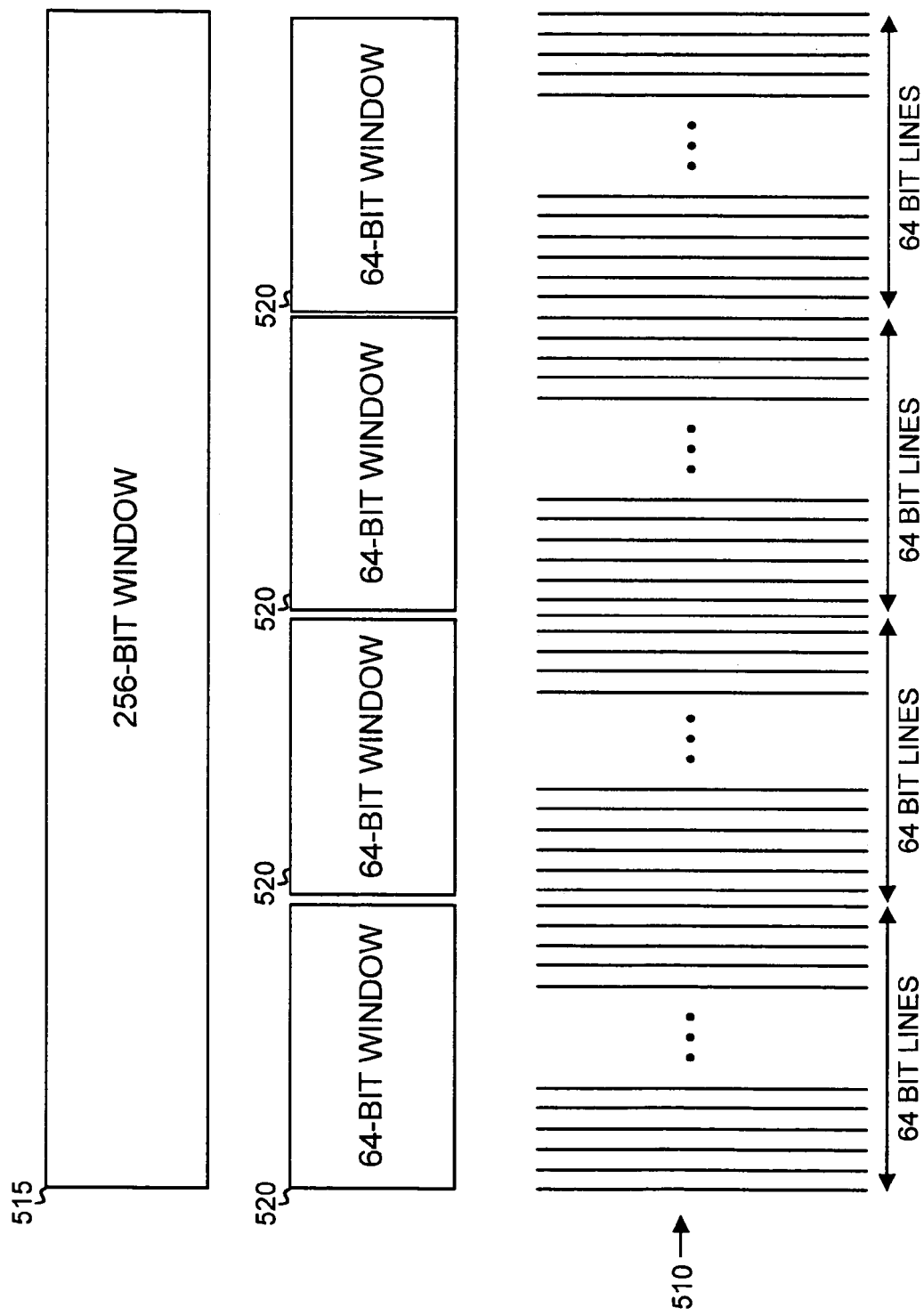
FIG. 5 is a diagram illustrating a programming window for the memory device of FIG. 1.

A programming window (or group) is illustrated in FIG. 5. Programming window 515 may include a certain number of bits (e.g., 256 in this example) that are to be written to memory cell core area 102 and may be mapped to 256 bit lines 510 in core area 102. Based on each of the bits in programming window 515, a corresponding bit line 510 will be either activated or not activated via the global bit lines and select transistors S0 through S7 (not shown in FIG. 5) to provide current on the activated drain bit lines from voltage supply generator 112. Programming window 515 may be further subdivided into sub-windows 520, such as by subdividing the 256 bits in programming window 515 into four 64-bit windows 520. In one implementation, sub-windows 520 may be programmed sequentially relative to one another. In this implementation, when sub-windows 520 are 64-bit windows, then each programming window 520 may simultaneously write 64 bits to core area 102 during a programming cycle.

In the exemplary implementation of FIG. 5, the program window size is described as being 64 bits wide. That is, programming is performed in 64-bit chunks. One of ordinary skill in the art will recognize that other program window sizes could be used.

As used herein, the concepts of "programming" a memory cell and "writing" a bit are not synonymous. Programming a memory cell refers to the application of voltages, as previously described, to the drain, source, and word lines of a memory cell such that charge is injected into charge storage layer 322. Writing a bit, however, may involve either programming a memory cell or not programming a memory cell, depending on the desired state of the memory cell. For example, if the programmed state of a memory cell is interpreted as a logic one, and a logic one is to be written to a memory cell, then the logic one bit is written by programming the memory cell. However, if the programmed state of a memory cell is interpreted as a logic one, and a logic zero is to be written to a memory cell, then: the logic zero bit is written by simply leaving the memory cell in the non-programmed state.

Generally, before writing to an area in core area 102, the memory cells 201 in that area are all set to a particular state. For example, an erase operation may be performed to initially remove the charge(s) from charge storage layer 322.

Figure 6:
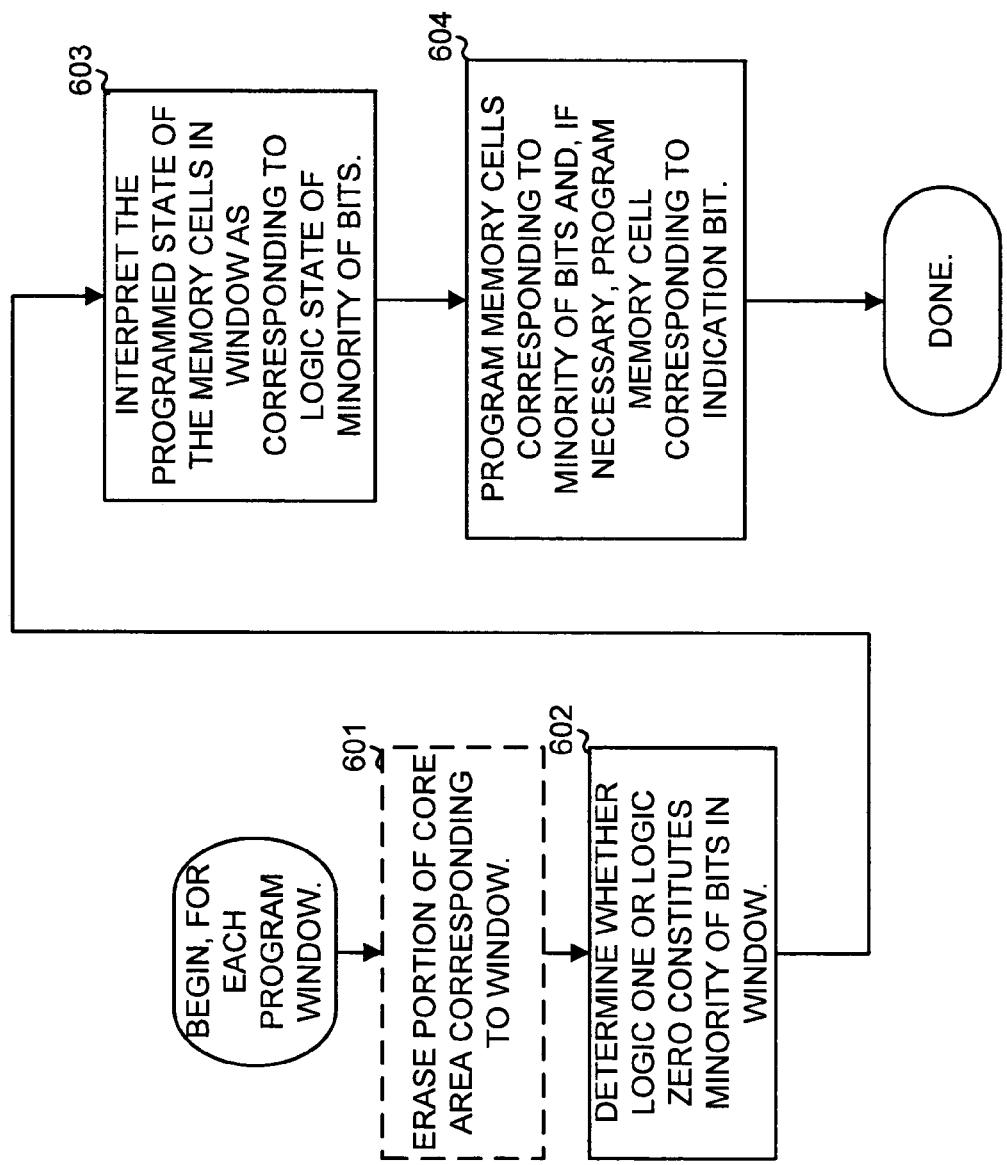
FIG. 6 is a flow chart illustrating exemplary operations for writing multiple bits to the core area shown in FIG. 1.

FIG. 6 is a flow chart illustrating exemplary operations for writing multiple bits to core area 102. A 64-bit sub-window 520 will be described as being written to core area 102, although one of ordinary skill in the art will recognize that other size windows or sub-windows could also be used.

To begin, if the memory cells 201 corresponding to sub-window 520 have not previously been erased or otherwise initialized to a uniform or known charge state, the memory cells 201 may be initially erased (act 601).

Figure 7:
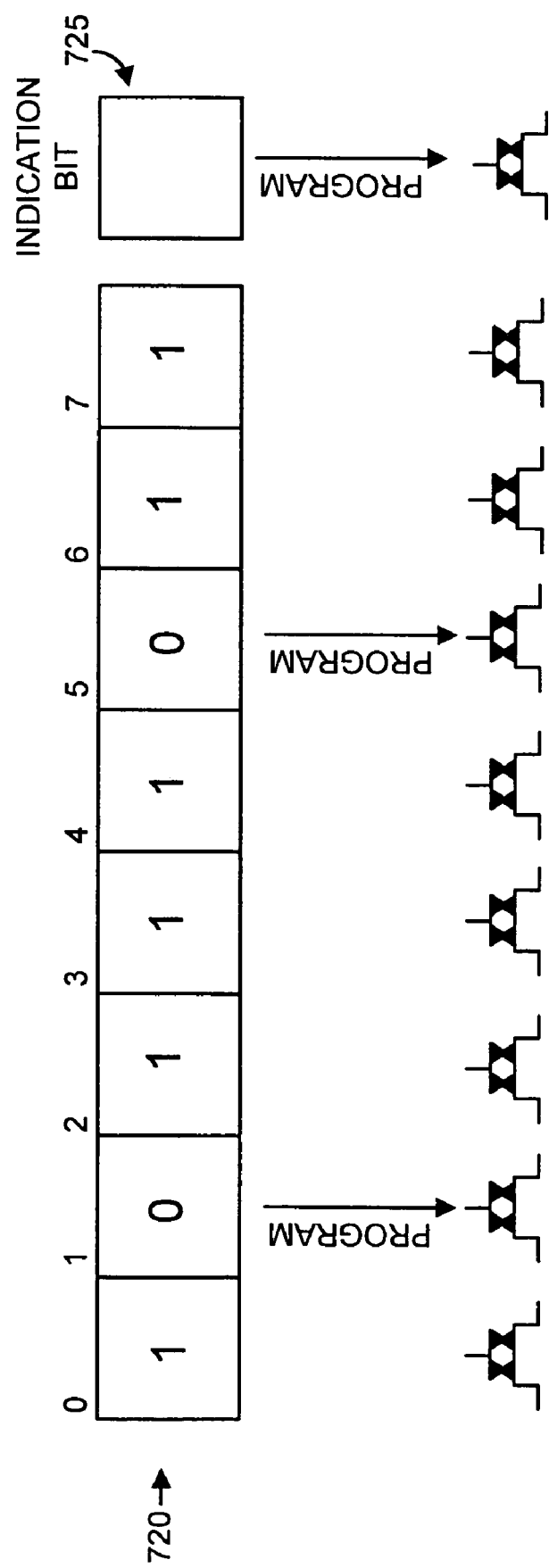
FIG. 7 is a diagram illustrating an exemplary simplified programming window.

Sub-window 520 may next be analyzed to determine whether a minority of bits in sub-window 520 are logic one or logic zero bits (act 602). For example, if sub-window 520 includes all zeros, the minority bit would be determined as logic one. If sub-window 520 includes half zeros and half ones, the minority bit could be determined as either logic one or logic zero. A further example of this concept is shown in FIG. 7, which is a diagram illustrating an exemplary eight-bit sub-window 720. Sub-window 720 includes two zero bits (bits 1 and 5) and six one bits (bits 0, 2-4, 6, and 7). Accordingly, the minority bit is the logic zero bit.

The programmed state of the memory cells corresponding to sub-window 720 (or sub-window 520) are interpreted as corresponding to a logic zero or logic one based on which logic state constituted the minority of the bits (act 603). For sub-window 720, for example, a programmed memory cell is interpreted as a logic zero since the minority of the bits are logic zero. An additional bit 725, called the indication bit herein, may be written with sub-window 720. Indication bit 725 may store a representation of which logic state constitutes the minority bits. In other words, indication bit 725, when later read, is used to determine how the programmed/non-programmed state of the memory cells corresponding to sub-window 720 are to be interpreted. An indication bit may be associated with each window or sub-window.

Sub-window 720 may then be written to core area 102 (act 604). In writing the sub-window, only the memory cells 201 corresponding to the minority bits are programmed. In the example of sub-window 720, the memory cells corresponding to bits 1 and 5 are programmed while the memory cells corresponding to bits 0, 2-4, 6, and 7 are left in the non-programmed state. Additionally, indication bit 725 may be programmed. Whether indication bit 725 is programmed depends on how memory device 100 is configured to interpret indication bit 725 (i.e., whether a programmed indication bit indicates that the programmed state of its associated memory cells are interpreted as logic one or logic zero). In this example, assume that indication bit 725 is programmed to indicate the programmed state is to be interpreted as logic zero and the non-programmed state as logic one.

The programming technique described above, which may be called the inverse programming method, insures that at most, only half of the bits in a programming window will actually need to be programmed when the window is written to core area 102. The programming technique can advantageously lead to less average power drain per bit that is written and less maximum current required per programming window. As an example of this, consider the exemplary situation in which 0.1 milliamps (mA) is needed to program one memory cell and a 64-bit programming window is being used. Without the programming techniques described herein, the 64-bit window may require as much as 6.4 mA of total current to program. If voltage supply generator 112 is limited to supplying, for example, 4 mA of current, a 64-bit window could not be used. With the above described programming techniques, however, the maximum total current required for a 64-bit program window can be nearly cut in half (approximately 3.3 mA) to program 32 bits plus the indication bit. In this situation, a 64 bit programming window could be used.

CONCLUSION

As described above, a Flash memory programming technique dynamically selects how to interpret the programmed/non-programmed state of memory cells.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 6, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A non-volatile memory device comprising:
   an array of non-volatile memory cells comprising
   a plurality of groups of memory cells in which the memory cells in the plurality of groups of memory cells include SONOS (silicon-oxide-nitride-oxide-silicon) type NOR memory cells that store two or more bits per memory cell; and
   a plurality of memory cells used to respectively indicate whether a programmed/non-programmed state of the memory cells in one of the groups is interpreted as a logic zero or a logic one.

2. The memory device of claim 1, further comprising:
   control logic configured to dynamically determine whether the programmed/non-programmed state of the memory cells in a first one of the groups are interpreted as a logic zero or a logic one.

3. The memory device of claim 2, wherein when dynamically determining, the control logic is configured to analyze logic states of bits that are to be written to the memory cells in the first group.

4. The memory device of claim 3, wherein when analyzing logic states, the control logic is configured to determine the logic state of a minority of the bits that are to be written to the first group.

5. The memory device of claim 1, wherein the array of non-volatile memory cells includes:
   a plurality of bit lines each connected to source or drain regions of the memory cells; and
   a plurality of word lines, arranged orthogonally to the bit lines, each word line being connected to gate regions of the memory cells.

6. The memory device of claim 1, wherein each of the groups is associated with 64 memory cells.

7. The memory device of claim 1, wherein the memory cells within a group are programmed simultaneously.

8. A method for writing data to memory cells of a non-volatile memory device comprising:
   receiving a predetermined number of bits that are to be written;
   analyzing the predetermined number of bits to determine a logic state of a minority of the bits;
   writing each of the bits to a memory cell in the memory device by programming those that correspond to the minority of the bits, the memory cell including a SONOS (silicon-oxide-nitride-oxide-silicon) type NOR memory cell that stores two or more bits per memory cell; and
   writing an indication bit that indicates the determined logic state of the minority of the bits.

9. The method of claim 8, wherein the writing each of the bits and the writing the indication bit are performed simultaneously.

10. The method of claim 8, wherein programming those of the predetermined number of bits that correspond to the minority of the bits includes storing charge in respective charge storage layers of memory cells corresponding to the bits.

11. The method of claim 8, wherein the predetermined number of bits is 64 bits.

12. The method of claim 8, further comprising:
    writing a separate indication bit for a plurality of portions of the predetermined number of bits.

13. The method of claim 8, further comprising:
    performing an erase operation before writing each of the bits.

14. A semiconductor memory device comprising:
an array of non-volatile memory cells organized as
   a plurality of memory cell windows, and
   a plurality of indication bit memory cells used to respectively indicate whether a programmed/non-programmed state of the memory cells in one of the memory cell windows is interpreted as a logic zero or a logic one; and
control logic configured to determine a programmed state of each indication bit memory cell based on an analysis of intended logic states of the non-volatile memory cells associated with one of the memory windows,
wherein the memory cells of the array of non-volatile memory cells include SONOS (silicon-oxide-nitride-oxide-silicon) type NOR memory cells that store two or more bits per memory cell.

15. The semiconductor device of claim 14, wherein the programmed states of the indication bit memory cells are determined based on a minimum number of memory cells within a memory cell window that are needed to be programmed.

16. The semiconductor device of claim 14, wherein the array of non-volatile memory cells includes:
   a plurality of bit lines each connected to source or drain regions of the non-volatile memory cells; and
   a plurality of word lines, arranged orthogonally to the bit lines, each word line being connected to gate regions of the non-volatile memory cells.

17. The semiconductor memory device of claim 14, wherein the non-volatile memory cells within one of the memory cell windows are programmed simultaneously.

* * * * *